(12) United States Patent
Park et al.

(10) Patent No.: US 12,369,479 B2
(45) Date of Patent: Jul. 22, 2025

(54) DISPLAY APPARATUS

(71) Applicant: Samsung Display Co., Ltd., Yongin-si (KR)

(72) Inventors: Hyekyung Park, Yongin-si (KR); Hyeonbum Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 492 days.

(21) Appl. No.: 17/944,645

(22) Filed: Sep. 14, 2022

(65) Prior Publication Data

US 2023/0130485 A1   Apr. 27, 2023

(30) Foreign Application Priority Data

Oct. 27, 2021   (KR) .......................... 10-2021-0144968

(51) Int. Cl.
*H10K 59/38* (2023.01)
*H10K 59/122* (2023.01)
*H10K 59/126* (2023.01)
*H10K 59/40* (2023.01)

(52) U.S. Cl.
CPC ........... *H10K 59/38* (2023.02); *H10K 59/122* (2023.02); *H10K 59/126* (2023.02); *H10K 59/40* (2023.02)

(58) Field of Classification Search
CPC .... H10K 59/38; H10K 59/122; H10K 59/126; H10K 59/40; H10K 59/353; H10K 50/856; H10K 50/844
See application file for complete search history.

(56) References Cited

U.S. PATENT DOCUMENTS

| | | | |
|---|---|---|---|
| 8,536,781 B2 | 9/2013 | Lee et al. | |
| 9,692,018 B2 | 6/2017 | Cho et al. | |
| 10,181,585 B2 | 1/2019 | Kim et al. | |
| 10,553,662 B2* | 2/2020 | Lee | H10K 59/122 |
| 12,219,799 B2* | 2/2025 | Lee | H10K 59/40 |
| 2020/0266392 A1* | 8/2020 | Lee | H10K 59/877 |
| 2021/0134906 A1* | 5/2021 | Lee | H10K 50/865 |
| 2022/0131111 A1* | 4/2022 | Lee | H10K 59/40 |
| 2022/0310728 A1* | 9/2022 | Bae | H10K 59/12 |
| 2022/0350445 A1* | 11/2022 | Bang | H10K 59/40 |
| 2023/0031230 A1* | 2/2023 | Lee | H10K 59/878 |
| 2023/0105374 A1* | 4/2023 | Jeong | H10K 59/352 |
| | | | 257/40 |

FOREIGN PATENT DOCUMENTS

| | | |
|---|---|---|
| KR | 10-1076262 | 10/2011 |
| KR | 10-2018-0002115 | 1/2018 |
| KR | 10-2019-0064701 | 6/2019 |
| KR | 10-2250043 | 5/2021 |

* cited by examiner

*Primary Examiner* — Douglas W Owens
(74) *Attorney, Agent, or Firm* — KILE PARK REED & HOUTTEMAN PLLC

(57) ABSTRACT

A display apparatus includes a display element layer arranged over a substrate and including display elements and a bank layer that includes a lower opening corresponding to each of the display elements, the lower opening defining an emission area in each of the display elements, a low reflection layer disposed over the display element layer, the low reflection layer including an opening corresponding to the emission area in each of the display elements, the lower reflection layer including an inorganic material, and a light-blocking layer disposed over the low reflection layer, the light-blocking layer including an upper opening that overlaps the lower opening, in a plan view.

20 Claims, 12 Drawing Sheets

DISPLAY APPARATUS

CROSS-REFERENCE TO RELATED APPLICATION(S)

This application claims priority to and benefits of Korean Patent Application No. 10-2021-0144968 under 35 U.S.C. § 119, filed on Oct. 27, 2021, in the Korean Intellectual Property Office, the entire contents of which are incorporated herein by reference.

BACKGROUND

1. Technical Field

The embodiments relate to a display apparatus.

2. Description of the Related Art

Because an organic light-emitting display apparatus has self-luminous characteristics and, unlike a liquid crystal display apparatus, does not require a separate light source, the thickness and weight of the organic light-emitting display apparatus may be reduced. An organic light-emitting display apparatus has characteristics such as low power consumption, high brightness, high response speed, and the like.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

A display apparatus according to the related art may have reduced visibility due to external light reflection.

The embodiments include a display apparatus having an improved visibility by reducing external light reflection, and improving light efficiency. However, such a technical problem is an example, and the disclosure is not limited thereto.

Additional aspects will be set forth in part in the description which follows and, in part, will be apparent from the description, or may be learned by practice of the presented embodiments of the disclosure.

According to the embodiments, a display apparatus may include a display element layer disposed over a substrate, the display element layer including display elements, and a bank layer including a lower opening corresponding to each of the display elements the lower opening defining an emission area in each of the display elements, a low reflection layer disposed over the display element layer, the low reflection layer including an inorganic material, the low reflection layer including an opening corresponding to the emission area in each of the display elements, and a light-blocking layer disposed over the low reflection layer, the light-blocking layer including an upper opening that overlaps the lower opening, in a plan view.

The display apparatus may further include an upper layer disposed on the light-blocking layer, the upper layer including a dye or a pigment.

The upper layer may include color filters, each of the color filters having a color that respectively corresponds to the display elements, the color of each of the color filters being different.

The upper layer may include a reflection-adjusting layer provided as an integral body and corresponding to the display elements.

The low reflection layer may include at least one of a metal and a metal oxide.

The low reflection layer may include at least one of bismuth (Bi), ytterbium (Yb), cobalt (Co), molybdenum (Mo), titanium (Ti), zirconium (Zr), aluminum (Al), chrome (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and a combination thereof.

A refractive index of the low reflection layer may be about 1 or more.

The bank layer may include a light-blocking material.

The display apparatus may further include a capping layer disposed on the display element layer. The low reflection layer may be disposed directly on the capping layer.

The upper opening may have a width greater than a width of the lower opening.

The display apparatus may further include a thin-film encapsulation layer disposed on the low reflection layer, and a touch sensor layer disposed on the thin-film encapsulation layer. The light-blocking layer may be disposed on the touch sensor layer.

According to the embodiments, a display apparatus may include a first electrode; a bank layer covering edges of the first electrode, the bank layer including a lower opening that overlaps the first electrode, in a plan view, an intermediate layer disposed on the bank layer, the intermediate layer overlapping the first electrode through the lower opening, in a plan view, a second electrode disposed on the intermediate layer, a low reflection layer disposed on the second electrode the low reflection layer including an opening that overlaps the lower opening of the bank layer, in a plan view, and a light-blocking layer disposed on the low reflection layer, the light-blocking layer including an upper opening that overlaps the lower opening, in a plan view.

The display apparatus may further include an upper layer disposed on the light-blocking layer, the upper layer including a dye or a pigment.

The low reflection layer may include at least one of a metal and a metal oxide.

The low reflection layer may include at least one of bismuth (Bi), ytterbium (Yb), cobalt (Co), molybdenum (Mo), titanium (Ti), zirconium (Zr), aluminum (Al), chrome (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and a combination thereof.

A refractive index of the low reflection layer may be about 1 or more.

The bank layer may include a light-blocking material.

The display apparatus may further include a capping layer disposed on the second electrode, wherein the low reflection layer may be disposed directly on the capping layer.

The upper opening may have a width greater than a width of the lower opening.

The display apparatus may further include a thin-film encapsulation layer disposed on the low reflection layer, and a touch sensor layer disposed on the thin-film encapsulation layer. The light-blocking layer may be disposed on the touch sensor layer.

BRIEF DESCRIPTION OF THE DRAWINGS

The above and other aspects, features, and advantages of the disclosure will be more apparent by describing in detail embodiments thereof with reference to the attached drawings, in which.

DETAILED DESCRIPTION OF THE EMBODIMENTS

Figure 1:
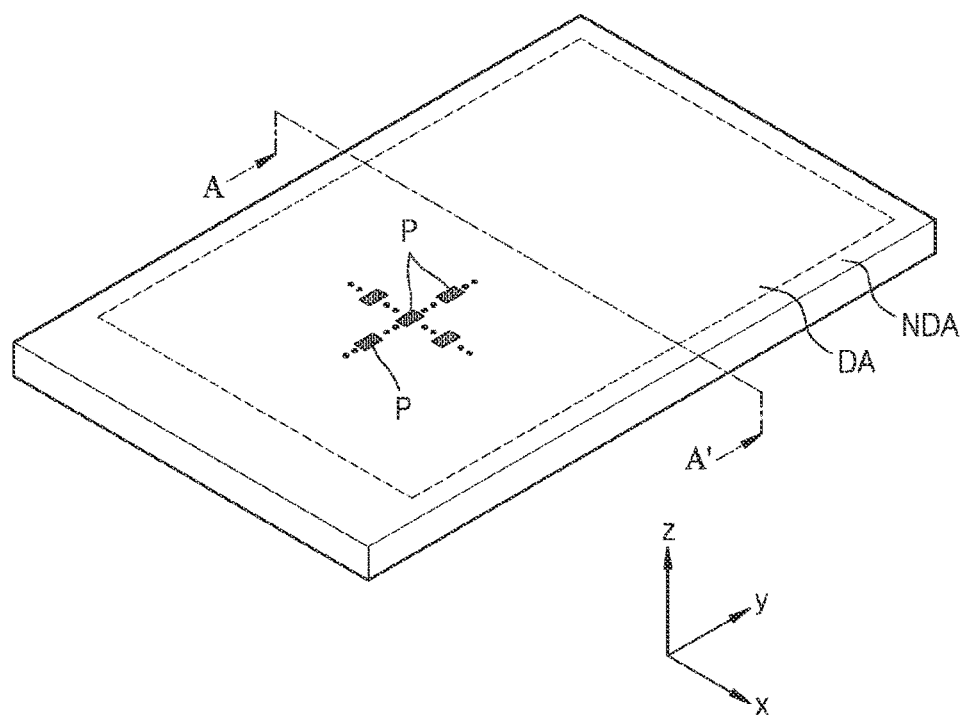
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

Throughout the disclosure, the expression "at least one of a, b, and c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

It will be further understood that, when a layer, region, or component is referred to as being "on" another layer, region, or component, it can be directly or indirectly on the other layer, region, or component. For example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

In the case where a certain embodiment may be implemented differently, a specific process order may be performed in the order different from the described order. As an example, two processes that are successively described may be substantially simultaneously performed or performed in the order opposite to the order described.

The terms "overlap" or "overlapped" mean that a first object may be above or below a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein FIG. 1 is a schematic perspective view of a display apparatus 1 according to an embodiment.

In an embodiment, the display apparatus 1 displays moving images or still images and may be used as a display screen of various products including televisions, notebook computers, monitors, advertisement boards, Internet of things (IoT) as well as portable apparatuses including mobile phones, smart phones, tablet personal computers (PC), mobile communication terminals, electronic organizers, electronic books, portable multimedia players (PMP), navigations, and ultra-mobile personal computers (UMPC).

In an embodiment, the display apparatus 1 may be used in wearable apparatuses including smartwatches, watchphones, glasses-type displays, and head-mounted displays (HMD). In an embodiment, the display apparatus 1 may be used as instrument panels for automobiles, center fascias of automobiles, or center information displays (CID) arranged on a dashboard, room mirror displays that replace side mirrors of automobiles, and displays arranged on the backside of front seats as an entertainment for back seats of automobiles. For convenience of description, FIG. 1 shows the display apparatus 1 is used as a smartphone.

Referring to FIG. 1, the display apparatus 1 according to an embodiment may include a display area DA and a non-display area NDA outside the display area DA. Though it is shown in FIG. 1 that the display area DA has an approximately rectangular shape, the embodiment is not limited thereto. The display area DA may have various shapes such as circles, ellipses, polygons, and the like.

The display area DA may be a portion that displays images, and sub-pixels P may be arranged in the display area DA. Each sub-pixel P may include a light-emitting element such as an organic light-emitting diode OLED. Each sub-pixel P may emit, for example, red, green, blue, or white light.

The display area DA may display images by using light emitted from the sub-pixels P. In the specification, as described above, a sub-pixel P may be defined as an emission area that emits one of red, green, blue, or white light.

The non-display area NDA may be a region in which the sub-pixels P are not arranged and may be a region that does not display images. A power supply line, a printed circuit board, or a terminal part may be disposed in the non-display area NDA, the power supply line driving the sub-pixels P, the printed circuit board including a driving circuit part, and a driver integrated circuit (IC) being connected to the terminal part.

Hereinafter, an organic light-emitting display apparatus is described as an example of the display apparatus according to an embodiment. However, the display apparatus according to an embodiment is not limited thereto. As an example, the display apparatus according to an embodiment may be an inorganic light-emitting display apparatus or a quantum-dot light-emitting display apparatus. As an example, an emission layer of a light-emitting element of the display apparatus may include an organic material or an inorganic material. Quantum dots may be arranged on a path of light emitted from the emission layer.

Figure 2:
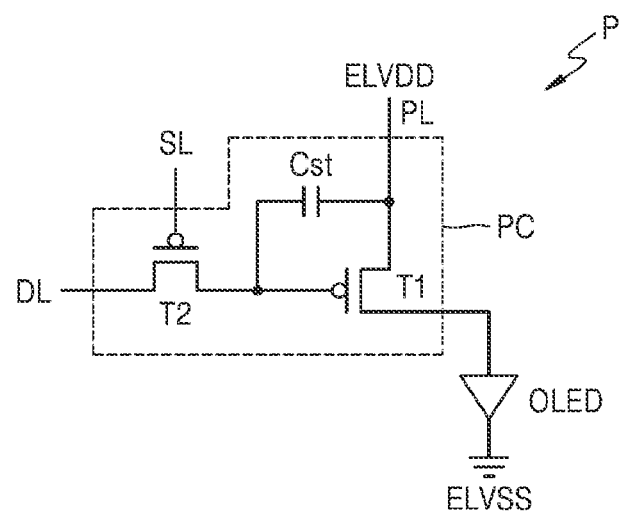
FIG. 2 is a schematic diagram of an equivalent circuit of a sub-pixel electrically connected to a display element according to an embodiment.

FIG. 2 is a schematic diagram of an equivalent circuit of a sub-pixel P of the display apparatus 1, and a sub-pixel circuit PC electrically connected to a display element according to an embodiment.

Referring to FIG. 2, an organic light-emitting diode OLED, which is a display element, may be connected to the sub-pixel circuit PC. The sub-pixel circuit PC may include a first thin-film transistor T1, a second thin-film transistor T2, and a storage capacitor Cst. The organic light-emitting diode OLED may emit, for example, red, green, blue, or white light.

The second thin-film transistor T2 may be a switching thin-film transistor electrically connected to a scan line SL and a data line DL, and may transfer a data voltage input from the data line DL to the first thin-film transistor T1 according to a switching voltage input from the scan line SL. The storage capacitor Cst may be electrically connected to the second thin-film transistor T2 and a driving voltage line PL and may store a voltage corresponding to a difference between a voltage transferred from the second thin-film transistor T2 and a first power voltage ELVDD supplied to the driving voltage line PL.

The first thin-film transistor T1 may be a driving thin-film transistor electrically connected to the driving voltage line PL and the storage capacitor Cst. The first thin-film transistor may control a driving current flowing from the driving voltage line PL to the organic light emitting diode OLED according to the voltage stored in the storage capacitor Cst. The organic light-emitting diode OLED may emit light having a brightness corresponding to the driving current. A first electrode (e.g., an anode) of the organic light-emitting diode OLED may be electrically connected to the sub-pixel circuit PC, and a second electrode (e.g., a cathode) of the organic light-emitting diode OLED may receive a second power voltage ELVSS.

Though it is shown in FIG. 2 that the sub-pixel circuit PC includes two thin-film transistors and one storage capacitor, the number of thin-film transistors or the number of storage capacitors may change depending on the design of the sub-pixel circuit PC.

Figure 3:
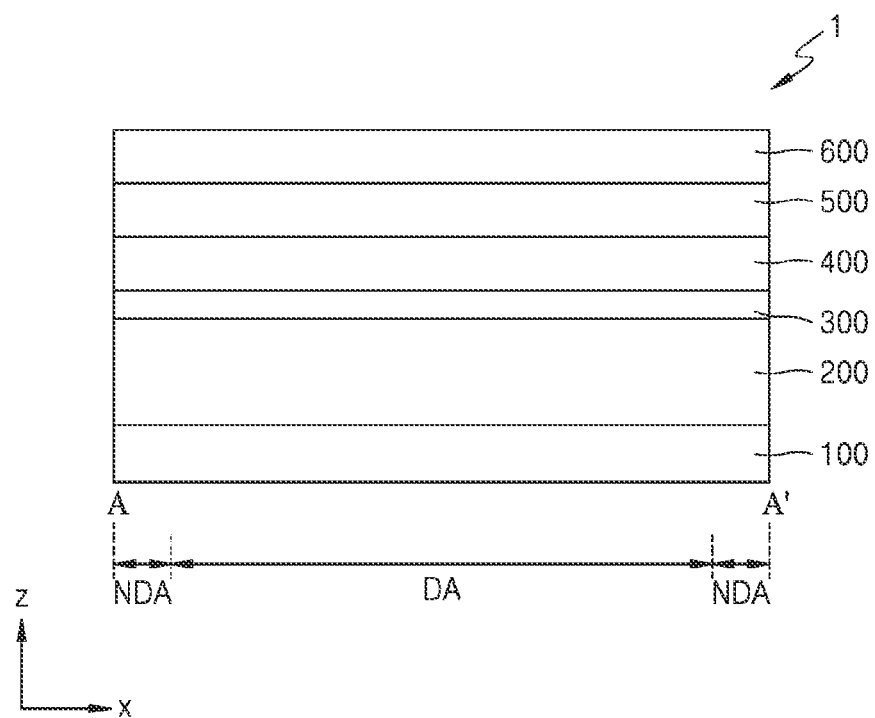
FIG. 3 is a schematic cross-sectional view of a display apparatus taken along line A-A' of FIG. 1, according to an embodiment.

FIG. 3 is a schematic cross-sectional view of the display apparatus 1, taken along a line A-A' of FIG. 1, according to an embodiment.

Referring to FIG. 3, the display apparatus 1 according to an embodiment may include a substrate 100, a display layer 200, a low reflection layer 300, a thin-film encapsulation layer 400, a touch sensor layer 500, and an anti-reflection layer 600.

The substrate 100 may include glass or a polymer resin. As an example, the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin is flexible, rollable, or bendable. The substrate 100 may have a multi-layered structure including a layer that includes a polymer resin and an inorganic layer (not shown).

The display layer 200 may include an organic light-emitting diode, a thin-film transistor, and insulating layers therebetween, the organic light-emitting diode being a display element, the thin-film transistor being electrically connected to the organic light-emitting diode.

The low reflection layer 300 may be disposed on the display layer 200, and the thin-film encapsulation layer 400 may be disposed on the low reflection layer 300. As an example, the display layer 200 and/or the low reflection layer 300 may be sealed by the thin-film encapsulation layer 400. The thin-film encapsulation layer 400 may include at least one inorganic layer and at least one organic layer.

In an embodiment, an encapsulation substrate (not shown) including glass may be provided instead of the thin-film encapsulation layer 400. The encapsulation substrate may be arranged on the display layer 200, and the display layer 200 may be disposed between the substrate 100 and the encapsulation substrate. There may be a gap between the encapsulation substrate and the display layer 200. A filling material may fill the gap.

The touch sensor layer 500 may be disposed on the thin-film encapsulation layer 400. The touch sensor layer 500 may sense an external input, for example, a touch of an object such as a finger or a stylus pen, and the display apparatus 1 may obtain coordinate information corresponding to the touched position. The touch sensor layer 500 may include touch electrode trace lines electrically connected to the touch electrode. The touch sensor layer 500 may sense an external input by using a mutual capacitance method or a self-capacitance method.

In an embodiment, the touch sensor layer 500 may be directly formed on the thin-film encapsulation layer 400. In other examples, the touch sensor layer 500 may be formed separately, and then attached to the thin-film encapsulation layer 400 through an adhesive layer such as an optically clear adhesive (OCA).

The anti-reflection layer 600 may be arranged on the touch sensor layer 500. The anti-reflection layer 600 may reduce reflectivity of light (external light) incident toward the display apparatus 1.

Figure 4A:
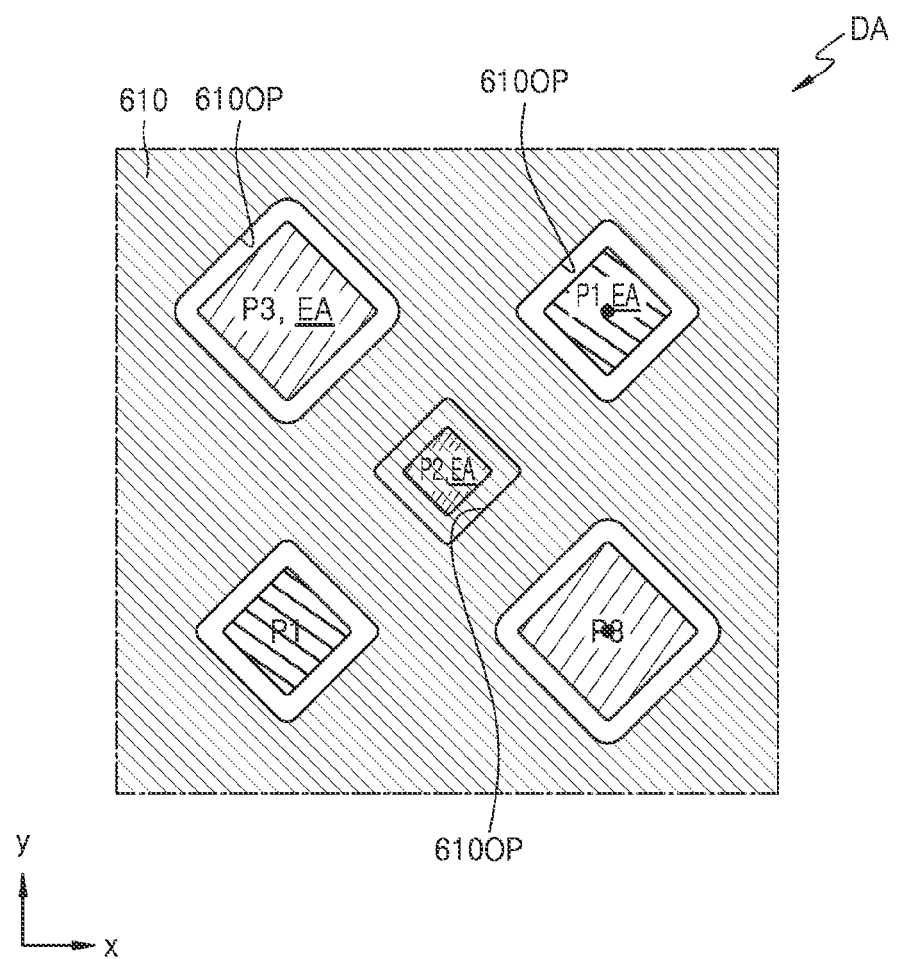
FIGS. 4A and 4B are schematic plan views of a portion of arrangement of a sub-pixel that may be included in a display area.
Figure 4B:
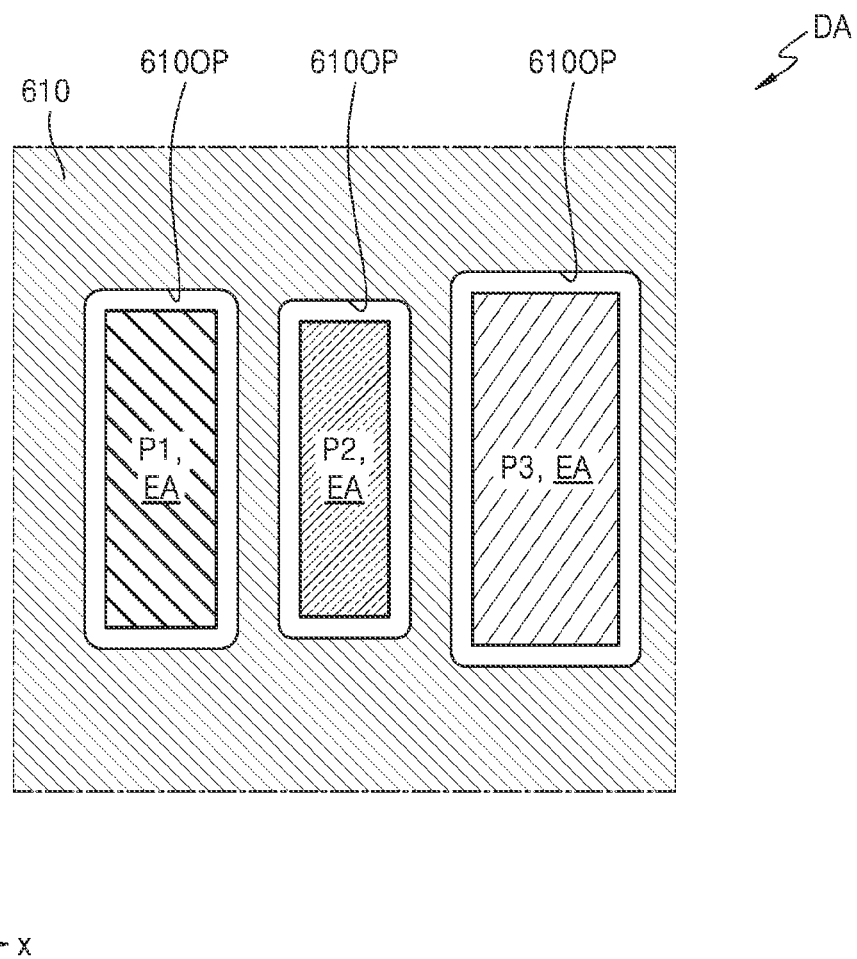

FIGS. 4A and 4B are schematic plan views of a portion of arrangement of the sub-pixel that may be included in the display area DA.

Referring to FIG. 4A, the display apparatus 1 may include sub-pixels. The sub-pixels may include a first sub-pixel P1, a second sub-pixel P2, and a third sub-pixel P3 emitting light of different colors. As an example, the first sub-pixel P1 may emit red light, the second sub-pixel P2 may emit green light, and the third sub-pixel P3 may emit blue light. However, the embodiment is not limited thereto. As an example, the first sub-pixel P1 may emit blue light, the second sub-pixel P2 may emit green light, and the third sub-pixel P3 may emit red light. Modifications may be made to the colors assigned to the sub-pixels.

The first sub-pixel P1, the second sub-pixel P2, and the third sub-pixel P3 may each have a quadrangular shape or another polygonal shape. In the specification, "polygonal" and "quadrangle" may include rounded shapes. In an embodiment, the first sub-pixel P1, the second sub-pixel P2, and the third sub-pixel P3 may each have a circular shape or an elliptical shape.

The sizes of the first sub-pixel P1, the second sub-pixel P2, and the third sub-pixel P3 may be different from one another. As an example, the area of the second sub-pixel P2 may be less than the area of the first sub-pixel P1 and the third sub-pixel P3. The area of the first sub-pixel P1 may be greater than the area of the third sub-pixel P3. In an embodiment, the sizes of the first sub-pixel P1, the second sub-pixel P2, and the third sub-pixel P3 may be substantially the same. Modifications may be made to the sizes of the sub-pixels.

In the specification, the sizes (or the widths) of the first sub-pixel P1, the second sub-pixel P2, and the third sub-pixel P3 may denote the sizes (or the widths) of the emission areas EA of the display elements implemented by the sub-pixels. The sizes (or the widths) of the emission areas EA may be defined by the sizes (or the widths) of lower openings 225OP of the bank layer 225 (refer to FIG. 5). The lower opening 225OP may substantially have a hole shape formed while a portion of the bank layer 225 is removed in the thickness direction of the bank layer 225 (refer to FIG. 5).

A light-blocking layer 610 arranged on the display layer includes an upper opening 610OP corresponding to each sub-pixel. The upper opening 610OP is a region formed by removing a portion of the light-blocking layer 610. Light emitted from the display element may be emitted to the outside through the upper opening 610OP. The upper opening 610OP may substantially have a hole shape that passes through the light-blocking layer 610 in the thickness direction of the light-blocking layer 610. A body portion of the light-blocking layer 610 may include a material that absorbs external light, and thus, visibility of the display apparatus may be improved. In an embodiment, the upper opening 610OP of the light-blocking layer 610 may have a quadrangular shape having round edges in a plan view.

In a plan view, the upper openings 610OP of the light-blocking layer 610 may overlap the first to third sub-pixels P1, P2, and P3. In an embodiment, the size (or the area or width) of each upper opening 610OP may be greater than the size (or the area or width) of a corresponding sub-pixel among the first to third sub-pixels P1, P2, and P3, and thus, the outline of each upper opening 610OP may surround the outline of the corresponding sub-pixel. Here, "corresponding" may denote "overlapping".

In an embodiment, the size (the area or width) of each upper opening 610OP of each light-blocking layer 610 may be substantially the same as the size (the area or width) of the first to third sub-pixels P1, P2, and P3.

As shown in FIG. 4A, the first sub-pixel P1, the second sub-pixel P2, and the third sub-pixel P3 may be arranged in a sub-pixel arrangement of a PENTILE™ structure. However, the embodiment is not limited thereto. As an example, as shown in FIG. 4B, the sub-pixels may be arranged in a stripe structure. In other embodiments, the first sub-pixel P1, the second sub-pixel P2, and the third sub-pixel P3 may be arranged in sub-pixel configuration structures such as a mosaic structure, a delta structure, and the like.

Figure 5:
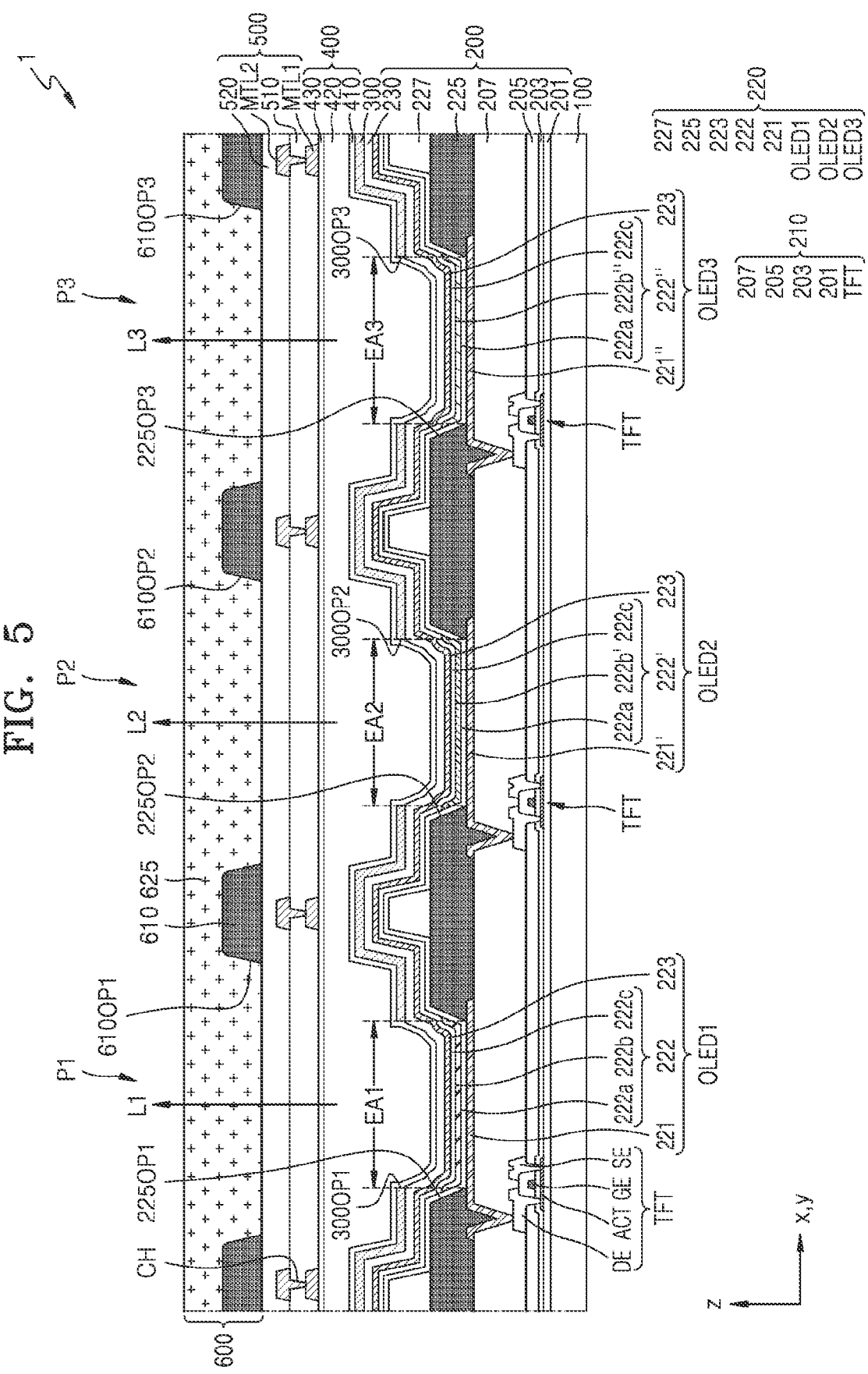
FIG. 5 is a schematic cross-sectional view of a display apparatus according to an embodiment.

FIG. 5 is a schematic cross-sectional view of the display apparatus 1 according to an embodiment. Hereinafter, the configuration of the display apparatus 1 according to an embodiment is described with reference to FIG. 5.

Referring to FIG. 5, the display apparatus 1 according to an embodiment may include the substrate 100, the display layer 200, the low reflection layer 300, the thin-film encapsulation layer 400, the touch sensor layer 500, and the anti-reflection layer 600.

The display layer 200 may be arranged on the substrate 100. The display layer 200 may include a sub-pixel circuit layer 210 and a display element layer 220. The sub-pixel circuit layer 210 may include thin-film transistors TFT, a buffer layer 201, a gate insulating layer 203, an interlayer insulating layer 205, and a planarization layer 207, which are insulating layers.

The buffer layer 201 may be arranged on the substrate 100, may reduce or block penetration of foreign materials, moisture, or external air from below the substrate 100, and provide a flat surface on the substrate 100. The buffer layer 201 may include an inorganic material, an organic material, or an organic/inorganic composite material, and include a single layer or a multi-layer including an inorganic material and an organic material, the inorganic material including oxide or nitride. A barrier layer (not shown) may be further arranged between the substrate 100 and the buffer layer 201, the barrier layer blocking penetration of external air. As an example, the buffer layer 201 may include silicon oxide ($SiO_x$) or silicon nitride ($SiN_x$).

The thin-film transistor TFT may be arranged on the buffer layer 201. The thin-film transistor TFT may include a semiconductor layer ACT, a gate electrode GE, a source electrode SE, and a drain electrode DE. The thin-film transistor TFT may be electrically connected to an organic light-emitting diode OLED to drive the organic light-emitting diode OLED.

The semiconductor layer ACT may be arranged on the buffer layer 201. The semiconductor layer ACT may include polycrystalline silicon or amorphous silicon. In other examples, the semiconductor layer ACT may include an oxide of at least one of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer ACT may include a channel region, a source region, and a drain region, the source region and the drain region being doped with impurities.

The gate electrode GE, the source electrode SE, and the drain electrode DE may each include various conductive materials. In an embodiment, the gate electrode GE may include at least one of molybdenum (Mo), aluminum (Al), copper (Cu), and titanium (Ti). As an example, the gate electrode GE may include a single Mo layer or a three-layered structure including a Mo layer, an Al layer, and a Mo layer. In an embodiment, the source electrode SE and the drain electrode DE may each include at least one of cupper (Cu), titanium (Ti), and aluminum (Al). As an example, the source electrode SE and the drain electrode DE may each include a three-layered structure of a Ti layer, an Al layer, and a Ti layer.

To insulate between the semiconductor layer ACT and the gate electrode GE, the gate insulating layer 203 may be disposed between the semiconductor layer ACT and the gate electrode GE. The interlayer insulating layer 205 may be disposed on the gate electrode GE, and the source electrode SE and the drain electrode DE may be disposed on the interlayer insulating layer 205.

The gate insulating layer 203 and the interlayer insulating layer 205 may each include an inorganic material such as silicon oxide, silicon nitride, and/or silicon oxynitride. The gate insulating layer 203 and the interlayer insulating layer 205 may each be insulating layers including an inorganic material. They may be formed by chemical vapor deposition (CVD) or atomic layer deposition (ALD). The embodiments described below may also be formed by CVD and ALD.

The planarization layer 207 may be arranged on the thin-film transistor TFT. To provide a flat upper surface, the planarization layer 207 is formed and then chemical mechanical polishing may be performed on the upper surface of the planarization layer 207. The planarization layer 207 may include a general-purpose polymer such as photosensitive polyimide, polyimide, polycarbonate (PC), benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, or a vinyl alcohol-based polymer. Though it is shown in FIG. 5 that the planarization layer 207 is a single layer, the planarization layer 207 may include a multi-layer structure in other examples. A first electrode 221 of the organic light-emitting diode OLED may be electrically connected to the thin-film transistor TFT through a contact hole of the planarization layer 207.

The display element layer 220 may be disposed on the sub-pixel circuit layer 210. The display element layer 220 may include a display element. In an embodiment, the display element layer 220 may include first to third organic light-emitting diodes OLED1, OLED2, and OLED3 as display elements, the bank layer 225, and a spacer 227.

The first to third organic light-emitting diodes OLED1, OLED2, and OLED3 may be arranged on the sub-pixel circuit layer 210. The first organic light-emitting diode OLED1 may include a stack structure including a first electrode 221, a first intermediate layer 222, and a second electrode 223, the first intermediate layer 222 including a first common layer 222a, a first emission layer 222b, and a second common layer 222c. The second organic light-emitting diode OLED2 may include a first electrode 221', a second intermediate layer 222', and the second electrode 223, the second intermediate layer 222' including the first common layer 222a, a second emission layer 222b', and the second common layer 222c. The third organic light-emitting diode OLED3 may include a first electrode 221", a third intermediate layer 222", and the second electrode 223, the third intermediate layer 222" including the first common layer 222a, a third emission layer 222b", and the second common layer 222c.

Hereinafter, description is made on the first organic light-emitting diode OLED1 included in the first sub-pixel P1. The second organic light-emitting diode OLED2, the third organic light-emitting diode OLED3, and the first organic light-emitting diode OLED1 have substantially the same the stack structures, and repeated descriptions thereof are omitted.

The first organic light-emitting diode OLED1 may include the first electrode 221, the first intermediate layer 222 (hereinafter, an intermediate layer 222), and the second electrode 223.

The first electrode 221 may be arranged on the planarization layer 207. The first electrode 221 may be arranged for each sub-pixel. The first electrodes 221 respectively corresponding to sub-pixels adjacent to each other may be apart from each other.

The first electrode 221 may be a reflective electrode. The first electrode 221 may include a reflective layer and a transparent or semi-transparent conductive layer on the reflective layer, the reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or semi-transparent conductive layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

The bank layer 225 may be disposed on the first electrode 221. The bank layer 225 may include first to third lower openings 225OP1, 225OP2, and 225OP3 that overlap the first electrodes 221 in a plan view, and expose the central portions of the first electrodes 221. The bank layer 225 may cover the edges of the first electrode 221 and prevent arcs and the like from occurring at the edges of the first electrode 221 by increasing a distance between the edges and the second electrode 223.

The first to third lower openings 225OP1, 225OP2, and 225OP3 of the bank layer 225 may respectively define first to third emission areas EA1, EA2, and EA3 of the first to third organic light-emitting diode OLED1, OLED2, and OLED3 included in the respective sub-pixels. The first to third lower openings 225OP1, 225OP2, and 225OP3 of the bank layer 225 may overlap their corresponding first to third emission areas EA1, EA2, and EA3, in a plan view. As shown in FIG. 5, the bank layer 225 may include the first lower opening 225OP1 that defines the first emission area EA1 of the first organic light-emitting diode OLED1 included in the first sub-pixel P1. The bank layer 225 may include the second lower opening 225OP2 that defines the second emission area EA2 of the second organic light-emitting diode OLED2 of the second sub-pixel P2. The bank layer 225 may include the third lower opening 225OP3 that defines the third emission area EA3 of the third organic light-emitting diode OLED3 of the third sub-pixel P3.

The bank layer 225 may include an organic insulating material. In other examples, the bank layer 225 may include an inorganic insulating material such as silicon nitride ($SiN_x$) or silicon oxide ($SiO_2$). In an embodiment, the bank layer 225 may include an organic insulating material and an inorganic insulating material.

The bank layer 225 may include a light-blocking material. As an example, the light-blocking material of the bank layer 225 may be black. The light-blocking material may include carbon black, carbon nanotubes, a resin or paste including black dye, metal particles, for example, nickel, aluminum, molybdenum, and an alloy thereof, metal oxide particles or metal nitride particles. In the case where the bank layer 225 includes a light-blocking material, external light reflection by metal structures arranged below the bank layer 225 may be reduced. However, the embodiment is not limited thereto. In another embodiment, the bank layer 225 may not include the light-blocking material but may include a light-transmissive organic insulating material.

The spacer 227 may be arranged on the bank layer 225. The spacer 227 may include an organic insulating material such as polyimide. In other examples, the spacer 227 may include an inorganic insulating material such as silicon nitride or silicon oxide, or include an organic insulating material and an inorganic insulating material. The spacer 227 may include a material different from that of the bank layer 225 including the light-blocking material. The spacer 227 and the bank layer 225 may be respectively formed in separate processes.

In another embodiment, the spacer 227 and the bank layer 225 may include the same material. The bank layer 225 and the spacer 227 may be simultaneously formed during a mask process that uses a half-tone mask.

The intermediate layer 222 may be formed on the first electrode 221 and the bank layer 225. The intermediate layer 222 may include the first common layer 222a, the emission layer 222b (for example, the first emission layer 222b), and the second common layer 222c.

The emission layer 222b may be disposed inside the first to third lower openings 225OP1, 225OP2, and 225OP3 of the bank layer 225. The emission layer 222b may include an organic material including a fluorescent or phosphorous material that may emit blue, green, or red light. The organic material may include a low molecular weight organic material or a polymer organic material.

The first common layer 222a may be disposed under the emission layer 222b, and the second common layer 222c may be disposed on the emission layer 222b. The first common layer 222a may include, for example, a hole transport layer (HTL), or include an HTL and a hole injection layer (HIL). The second common layer 222c may include, for example, an electron transport layer (ETL), or include an ETL and an electron injection layer (EIL). In an embodiment, the second common layer 222c may be omitted.

The emission layer 222b is arranged for each sub-pixel to correspond to the first to third lower openings 225OP1, 225OP2, and 225OP3 of the bank layer 225. In contrast, the first common layer 222a and the second common layer 222c may each be formed as an integral body to cover the substrate 100 entirely. In other words, the first common layer 222a and the second common layer 222c may each be formed as an integral body to cover the display area DA of the substrate 100.

The second electrode 223 may be a cathode which is an electron injection electrode. The second electrode 223 may include a conductive material having a low work function. As an example, the second electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. In other examples, the second electrode 223 may further include a layer on the (semi) transparent layer, the layer including ITO, IZO, ZnO, or $In_2O_3$.

The display layer 200 may further include a capping layer 230 arranged on the display element layer 220. In an embodiment, the capping layer 230 may be arranged on the first to third organic light-emitting diodes OLED1, OLED2, and OLED3. In an embodiment, the capping layer 230 may improve a light-emission efficiency of the first to third organic light-emitting diodes OLED1, OLED2, and OLED3 due to the principle of constructive interference.

The capping layer 230 may be an organic capping layer including an organic material, an inorganic capping layer including an inorganic material, or a composite capping layer including an organic material and an inorganic material. As an example, the capping layer 230 may include a carbocyclic compound, a heterocyclic compound, an amine group-containing compound, porphine derivatives, phthalocyanine derivatives, naphthalocyanine derivatives, alkali metal complexes, alkali earth metal complexes, or a combination thereof. Carbocyclic compounds, heterocyclic compounds, and amine group-containing compounds may optionally be substituted with substituents including O, N, S, Se, Si, F, Cl, Br, I, or a combination thereof.

The low reflection layer 300 may be arranged on the capping layer 230. Because the capping layer 230 may be arranged on the first to third organic light-emitting diodes OLED1, OLED2, and OLED3, the low reflection layer 300 may be arranged over the first to third organic light-emitting diodes OLED1, OLED2, and OLED3. The low reflection layer 300 may include an inorganic material having a relatively low reflectivity. In an embodiment, the low reflection layer 300 may include metal or metal oxide. In the case where the low reflection layer 300 includes metal, the metal may include, for example, one of ytterbium (Yb), bismuth (Bi), cobalt (Co), molybdenum (Mo), titanium (Ti), zirconium (Zr), aluminum (Al), chrome (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof. In the case where the low reflection layer 300 includes metal oxide, the metal oxide may include, for example, one of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, SiNx, LiF, $CaF_2$, $MgF_2$, CdS, or a combination thereof.

In an embodiment, an absorption coefficient k of an inorganic material of the low reflection layer 300 may be about 0.5 or more and about 4.0 or less ($0.5 \leq k \leq 4.0$). An inorganic material of the low reflection layer 300 may include a material having a refractive index n of about 1 or more ($n \geq 1.0$).

The low reflection layer 300 may reduce external light reflectivity by inducing light incident to the inside of the display apparatus 1 to destructively interfere with light reflected by metal arranged below the low reflection layer 300. As an example, light reflected by the upper surface of the low reflection layer 300 and light reflected by the upper surface of the second electrode 223 may be induced to destructively interfere with each other and cancel each other. Because external light reflectivity is reduced by the low reflection layer 300, the display quality and visibility of the display apparatus 1 may be improved.

The low reflection layer 300 may include first to third openings 300OP1, 300OP2, and 300OP3 respectively corresponding to the first to third emission areas EA1, EA2, and EA3. The low reflection layer 300 may include the first opening 300OP1 corresponding to the first emission area EA1, the second opening 300OP2 corresponding to the second emission area EA2, and the third opening 300OP3 corresponding to the third emission area EA3. In a plan view, the first opening 300OP1 of the low reflection layer 300 may overlap the first lower opening 225OP1 of the bank layer 225, the second opening 300OP2 may overlap the second lower opening 225OP2, and the third opening 300OP3 may overlap the third lower opening 225OP3.

In an embodiment, the first to third openings 300OP1, 300OP2, and 300OP3 of the low reflection layer 300 may respectively have the same widths as those of the first to third lower openings 225OP1, 225OP2, and 225OP3 of the bank layer 225. In other examples, the widths of the first to third openings 300OP1, 300OP2, and 300OP3 of the low reflection layer 300 may be respectively less or greater than those of the first to third lower openings 225OP1, 225OP2, and 225OP3 of the bank layer 225.

In a comparative example, in case that the low reflection layer 300 is disposed over the entire surface of the display area DA, similar to the second electrode 223, external light reflectivity may be reduced but light efficiency of the display apparatus 1 may also be reduced. In case that the low reflection layer 300 covers the first to third emission areas EA1, EA2, and EA3, external light reflectivity may be reduced but a light efficiency of the first to third organic light-emitting diodes OLED1, OLED2, and OLED3 may be reduced.

According to an embodiment, the low reflection layer 300 may have the first to third openings 300OP1, 300OP2, and 300OP3 respectively corresponding to the first to third emission areas EA1, EA2, and EA3. Thus, light emitted from the first to third organic light-emitting diodes OLED1, OLED2, and OLED3 may be emitted without being affected the low reflection layer 300, and light efficiency of the display apparatus 1 may be improved.

The thin-film encapsulation layer 400 may be arranged on the low reflection layer 300. The thin-film encapsulation layer 400 may include at least one inorganic layer and at least one organic layer. As an example, as shown in FIG. 5, the thin-film encapsulation layer 400 may include a first inorganic encapsulation layer 410, an organic encapsulation layer 420, and a second inorganic encapsulation layer 430 that are sequentially stacked.

The first inorganic encapsulation layer 410 and the second inorganic encapsulation layer 430 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The first inorganic encapsulation layer 410 and the second inorganic encapsulation layer 430 may each have a single-layered structure or a multi-layered structure including the inorganic insulating material.

The organic encapsulation layer 420 may alleviate internal stress of the first inorganic encapsulation layer 410 and/or the second inorganic encapsulation layer 430. The organic encapsulation layer 420 may include a polymer-based material. As an example, the organic encapsulation layer 420 may include polyethylene terephthalate, polyethylene naphthalate, polycarbonate, polyimide, polyethylene sulfonate, polyoxymethylene, polyarylate, hexamethyldisiloxane, an acryl-based resin (e.g., polymethylmethacrylate, poly acrylic acid, etc.), or a combination thereof.

The thin-film encapsulation layer 400 may have a multi-layered structure of the first inorganic encapsulation layer 410, the organic encapsulation layer 420, and the second inorganic encapsulation layer 430. Even though cracks may occur in the thin-film encapsulation layer 400, the cracks may not propagate between the first inorganic encapsulation layer 410 and the organic encapsulation layer 420, or between the organic encapsulation layer 420 and the second inorganic encapsulation layer 430. The thin-film encapsulation layer 400 may prevent or reduce external moisture, oxygen, or the like from penetrating to the display area DA.

The touch sensor layer 500 may be arranged on the thin-film encapsulation layer 400. The touch sensor layer 500 may include a first conductive layer MTL1, a first touch insulating layer 510, a second conductive layer MTL2, and a second touch insulating layer 520. The first conductive layer MTL1 may be disposed (for example, directly disposed) on the thin-film encapsulation layer 400. As an example, the first conductive layer MTL1 may be directly disposed on the second inorganic encapsulation layer 430 of the thin-film encapsulation layer 400. However, the embodiment is not limited thereto.

In an embodiment, the touch sensor layer 500 may include an insulating layer (not shown) between the first conductive layer MTL1 and the thin-film encapsulation layer 400. The insulating layer may be arranged on the second inorganic encapsulation layer 430 of the thin-film encapsulation layer 400 to planarize a surface on which the first conductive layer MTL1 and the like is arranged. The insulating layer may include an inorganic insulating material such as silicon oxide, silicon nitride, and silicon oxynitride. In an embodiment, the insulating layer may include an organic insulating material.

The first touch insulating layer 510 may be arranged on the first conductive layer MTL1. The first touch insulating layer 510 may include an inorganic material or an organic material. In the case where the first touch insulating layer 510 includes an inorganic material, the first touch insulating layer 510 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. In the case where the first touch insulating layer 510 includes an organic material, the first touch insulating layer 510 may include at least one of an acryl-based resin, a methacryl-based resin, a polyisoprene, a vinyl-based resin, an epoxy-based resin, a urethane-based resin, a cellulose resin, and a perylene-based resin.

The second conductive layer MTL2 may be arranged on the first touch insulating layer 510. The second conductive layer MTL2 may serve as a sensor that senses a user's touch input. The first conductive layer MTL1 may serve as a connector that electrically connects the second conductive layers MTL2 patterned in one direction. In an embodiment, both the first conductive layer MTL1 and the second conductive layer MTL2 may serve as sensors. The first conductive layer MTL1 may be electrically connected to the second conductive layer MTL2 through a contact hole CH. In the case where both the first conductive layer MTL1 and the second conductive layer MTL2 may serve as sensors, the resistance of the touch electrode is reduced, and a user's touch input may be swiftly sensed.

In an embodiment, the first conductive layer MTL1 and the second conductive layer MTL2 may have a structure through which light emitted from the organic light-emitting diode OLED passes, for example, a mesh structure. The first conductive layer MTL1 and the second conductive layer MTL2 may not overlap the emission area EA of the organic light-emitting diode OLED in a plan view.

The first conductive layer MTL1 and the second conductive layer MTL2 may include a metal layer or a transparent conductive layer. The metal layer may include at least one of molybdenum (Mo), silver (Ag), titanium (Ti), copper (Cu), aluminum (Al), and an alloy thereof. The transparent conductive layer may include a transparent conductive oxide such as indium tin oxide (ITO), zinc oxide (ZnO), and indium tin zinc oxide (ITZO), a conductive polymer such as poly(3,4-ethylenedioxythiophene) (PEDOT), a metal nanowire, a carbon nanotube, or graphene.

The second touch insulating layer 520 may be disposed on the second conductive layer MTL2. The second touch insulating layer 520 may include an inorganic material or an organic material. In case that the second touch insulating layer 520 includes an inorganic material, the second touch insulating layer 520 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. In case that the second touch insulating layer 520 includes an organic material, the second touch insulating layer 520 may include at least one of an acryl-based resin, a methacryl-based resin, a polyisoprene, a vinyl-based resin, an epoxy-based resin, a urethane-based resin, a cellulose resin, and a perylene-based resin.

In other examples, the touch sensor layer 500 may include the first conductive layer MTL1, the first touch insulating layer 510, and the second conductive layer MTL2, and may not include the second touch insulating layer 520. The light-blocking layer 610 may have a structure that covers the second conductive layer MTL2. Portions of the first touch insulating layer 510 may be exposed through the first to third upper openings 610OP1, 610OP2, and 610OP3 of the light-blocking layer 610.

The anti-reflection layer 600 may be disposed on the touch sensor layer 500. The anti-reflection layer 600 may reduce reflectivity of light (external light) incident toward the display apparatus 1 from the outside. The anti-reflection layer 600 may include the light-blocking layer 610 and an upper layer (not shown) including dye or a pigment. In an embodiment, the upper layer (not shown) may include a reflection-adjusting layer 625 as shown in FIG. 5.

The light-blocking layer 610 may include first to third upper openings 610OP1, 610OP2, and 610OP3 respectively corresponding to the first to third emission areas EA1, EA2, and EA3. As described above, the first to third emission areas EA1, EA2, and EA3 may be respectively defined by the first to third lower openings 225OP1, 225OP2, and 225OP3 of the bank layer 225. The first to third upper openings 610OP1, 610OP2, and 610OP3 of the light-blocking layer 610 may respectively overlap the first to third lower openings 225OP1, 225OP2, and 225OP3 of the bank layer 225 in a plan view. The first to third upper openings 610OP1, 610OP2, and 610OP3 may respectively correspond to the first to third emission areas EA1, EA2, and EA3 of the first to third organic light-emitting diodes OLED1, OLED2, and OLED3. The first upper opening 610OP1 of the light-blocking layer 610 may overlap the first lower opening 225OP1 of the bank layer 225 in a plan view, the second upper opening 610OP2 may overlap the second lower opening 225OP2 in a plan view, and the third upper opening 610OP3 may overlap the third lower opening 225OP3 in a plan view.

The widths of the first to third upper openings 610OP1, 610OP2, and 610OP3 of the light-blocking layer 610 may be respectively greater than those of the first to third lower openings 225OP1, 225OP2, and 225OP3 of the bank layer 225.

In case that the light-blocking layer 610 and the bank layer 225 each have a slope in their lateral surface, the width of each of the openings of the light-blocking layer 610 and the bank layer 225 may change in the thickness direction. In an embodiment, the width of the opening denotes its minimum width.

The width of the first upper opening 610OP1 may be greater than the width of the first lower opening 225OP1. The width of the second upper opening 610OP2 may be greater than the width of the second lower opening 225OP2. The width of the third upper opening 610OP3 may be greater than the width of the third lower opening 225OP3. Thus, the lateral viewing angle of the display apparatus 1 may be improved.

In case that the width of the first upper opening 610OP1 is equal to or less than the width of the first lower opening 225OP1, the user may see light emitted from the first to third organic light-emitting diodes OLED1, OLED2, and OLED3 and progressing in a z direction but light emitted in other directions may not be as visible. In the embodiments where the display apparatus has the wider first upper opening 610OP1 than the first lower opening 225OP1, the lateral viewing angles may be improved.

The widths of the first to third upper openings 610OP1, 610OP2, and 610OP3 of the light-blocking layer 610 may be respectively different from the first to third openings 300OP1, 300OP2, and 300OP3 of the low reflection layer 300 corresponding thereto. The first to third openings 300OP1, 300OP2, and 300OP3 of the low reflection layer 300 may respectively have widths less than the widths of the first to third upper openings 610OP1, 610OP2, and 610OP3 of the light-blocking layer 610. As an example, the first opening 300OP1 of the low reflection layer 300 that overlaps the first emission area EA1 may have a width less than the width of the first upper opening 610OP1, in a plan view. In an embodiment, at least a portion of the low reflection layer 300 may overlap the first upper opening 610OP1, but may not overlap the first lower opening 225OP1 of the bank layer 225. When a portion of the low reflection layer 300 is disposed in this region, external light reflection may be suppressed while a light efficiency of the display apparatus 1 may not be deteriorated.

The reflection-adjusting layer 625 may selectively absorb in some wavelength bands among light reflected from the display apparatus or light incident from the outside of the display apparatus. The reflection-adjusting layer 625 may include an organic material layer including dye, a pigment, or a combination thereof.

The reflection-adjusting layer 625 may include a tetra aza porphyrin (TAP)-based compound, a porphyrin-based compound, a metal porphyrin-based compound, an oxazine-based compound, a squarylium-based compound, a triarylmethane-based compound, a polymethine-based compound, a traquinone-based compound, a phthalocyanine-based compound, an azo-based compound, a perylene-based compound, an xanthene-based compound, a diimmonium-based compound, a dipyrromethene-based compound, a cyanine-based compound, or a combination thereof.

In an embodiment, reflectivity of the reflection-adjusting layer 625 measured in a specular component included (SCI) mode may be about 10% or less. Because the reflection-adjusting layer 625 absorbs external light reflection of the display apparatus, visibility may be improved.

The reflection-adjusting layer 625 may be disposed on the entire surface of the display area DA to cover the light-blocking layer 610 and the first to third upper openings 610OP1, 610OP2, and 610OP3 of the light-blocking layer 610. As shown in FIG. 5, the reflection-adjusting layer 625 may be formed as an integral body to correspond to the first to third organic light-emitting diodes OLED1, OLED2, and OLED3. As an example, all of the light L1, L2, and L3 emitted from the first to third organic light-emitting diodes OLED1, OLED2, and OLED3 may pass through the reflection-adjusting layer 625.

In an embodiment, because the reflection-adjusting layer 625 formed as an integral body is provided instead of a color filter layer 621 (refer to FIG. 6) including first to third color filters 621*a*, 621*b*, and 621*c* (refer to FIG. 6) of different colors, the number of processes may be reduced, and processing costs may be reduced.

In an embodiment, the reflection-adjusting layer 625 may have a transmittance of about 60% to about 80%. A light transmittance of the reflection-adjusting layer 625 may be adjusted according to the content of pigment and/or dye of the reflection-adjusting layer 625.

Figure 6:
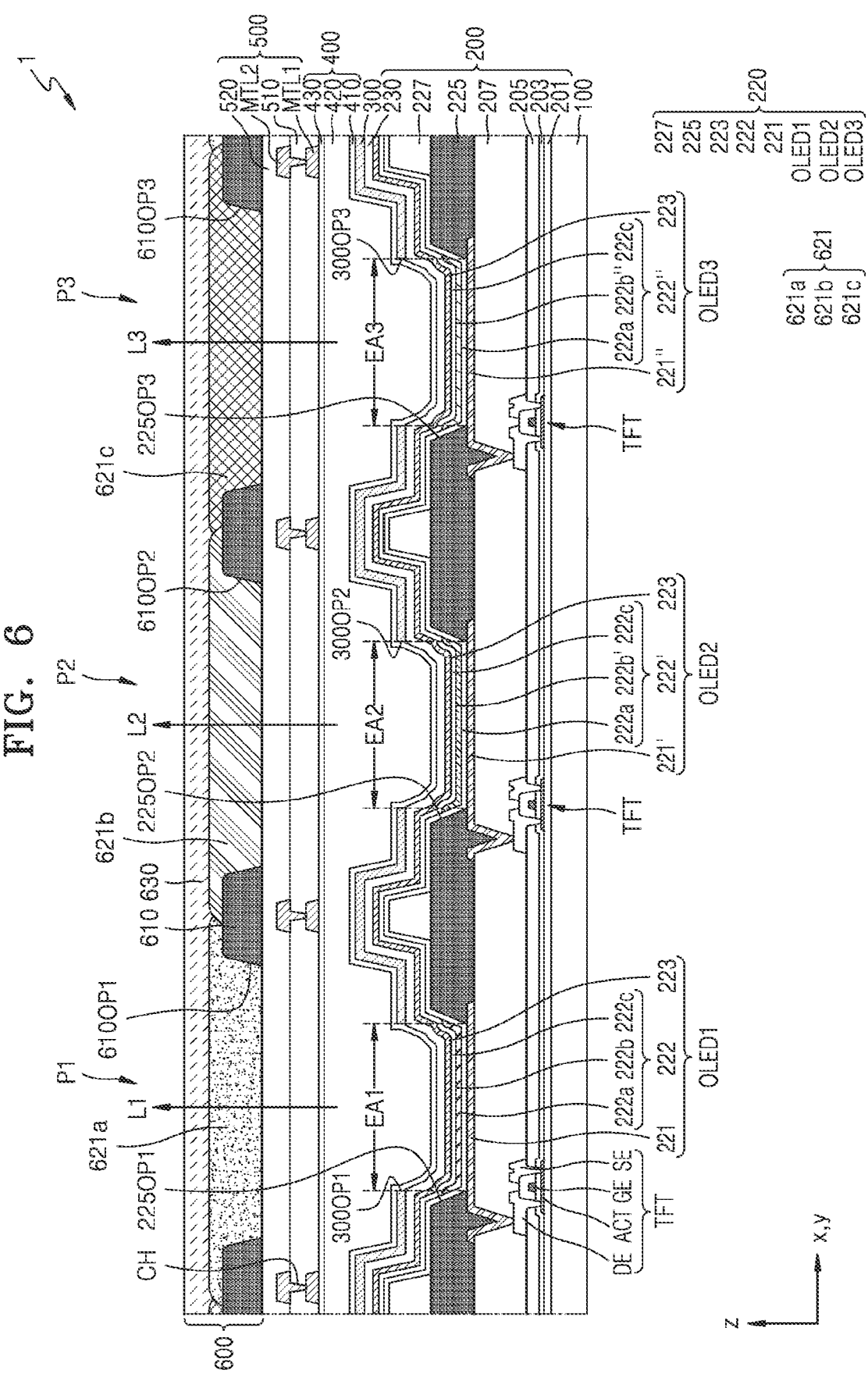
FIGS. 6 and 7 are schematic cross-sectional views of a portion of a display apparatus according to an embodiment, showing modified embodiments of FIG. 5.
Figure 7:
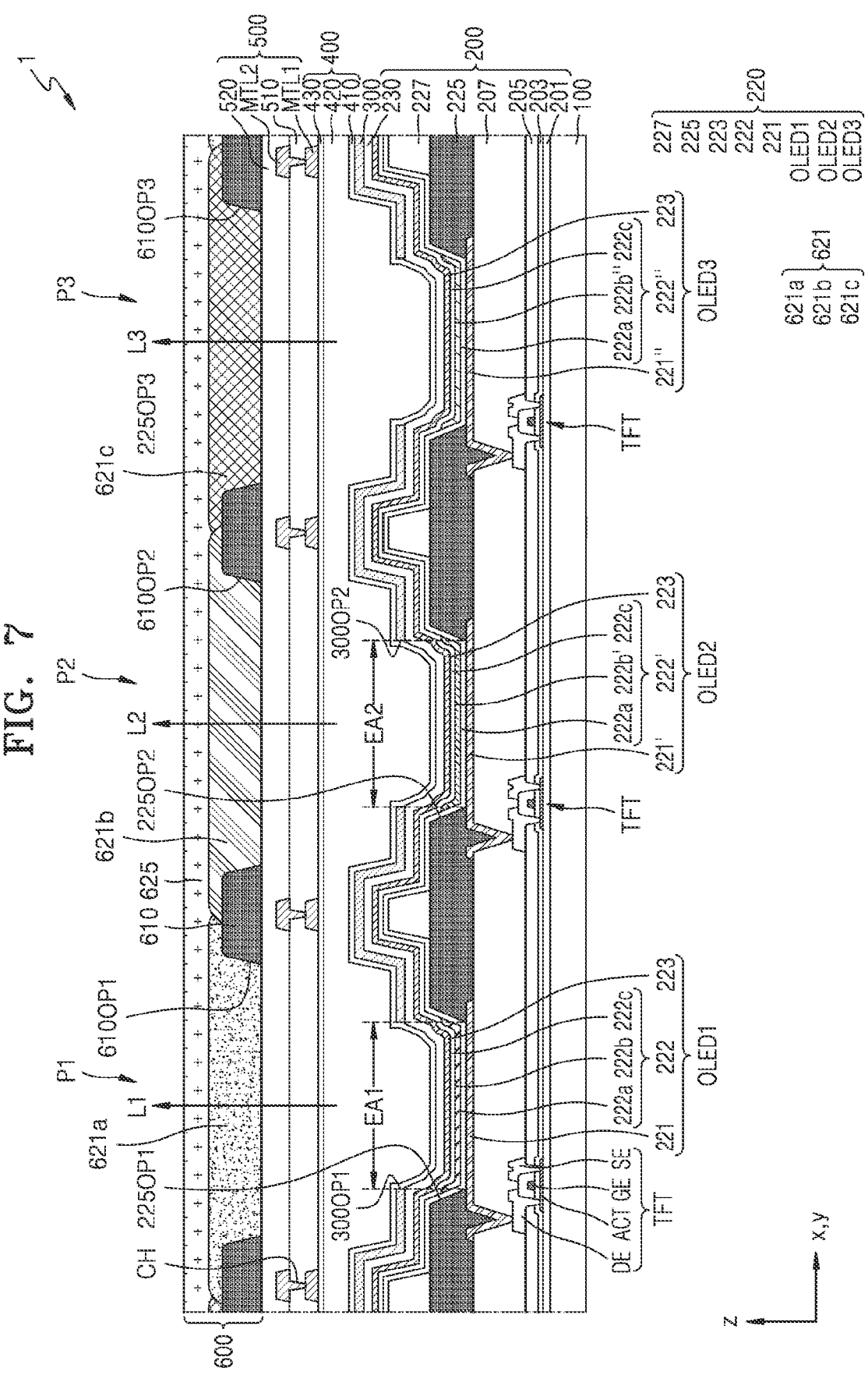

FIGS. 6 and 7 are schematic cross-sectional views of a portion of the display apparatus according to an embodiment, showing modified embodiments of FIG. 5.

The display apparatus 1 of FIGS. 6 and 7 may include the same structure as that of the low reflection layer 300 described above with reference to FIG. 5. As an example, the low reflection layer 300 of the display apparatus 1 may include the first to third openings 300OP1, 300OP2, and 300OP3 respectively corresponding to the first to third emission areas EA1, EA2, and EA3. The display apparatus 1 of FIGS. 6 and 7 is different from the embodiment described with reference to FIG. 5 in the construction of the anti-reflection layer 600. Hereinafter, the differences in the anti-reflection layer 600 will be described while repetitive descriptions will be omitted.

In an embodiment, as shown in FIG. 6, an upper layer (not shown) may include the first to third color filters 621*a*, 621*b*, and 621*c* of different colors respectively corresponding to the first to third organic light-emitting diodes OLED1, OLED2, and OLED3, and may not include the reflection-adjusting layer 625 formed as an integral body.

In an embodiment, the first to third color filters 621*a*, 621*b*, and 621*c* may be respectively disposed in the first to third upper openings 610OP1, 610OP2, and 610OP3 of the light-blocking layer 610. The color filters 621*a*, 621*b*, and 621*c* may have colors corresponding to lights emitted from first to third emission areas EA1, EA2, and EA3. In an embodiment, where the first emission area EA1 emits red light, the first color filter 621*a* may be a red color filter, where the second emission area EA2 emits green light, the second color filter 621*b* may be a green color filter, and where the third emission area EA3 emits blue light, the third color filter 621*c* may be a blue color filter.

An overcoat layer 630 may be arranged on the light-blocking layer 610 and the color filter layer 621. The overcoat layer 630 is a colorless light-transmissive layer that does not have a color in the visible light band and may planarize the upper surface of the light-blocking layer 610 and the upper surface of the color filter layer 621. The overcoat layer 630 may include a colorless light transmissive organic material such as an acryl-based resin and be covered by a window (not shown).

Referring to FIG. 7, in an embodiment, the upper layer (not shown) may include the reflection-adjusting layer 625 and the first to third color filters 621*a*, 621*b*, and 621*c*. The upper layer of the display apparatus 1 may include the reflection-adjusting layer 625 applied in common to each sub-pixel, and the first to third color filters 621*a*, 621*b*, and 621*c* of different colors respectively corresponding to the first to third organic light-emitting diodes OLED1, OLED2, and OLED3 of the sub-pixels. Thus, light transmittance may be increased, and simultaneously, external light reflection may be reduced.

In an embodiment, though the display apparatus 1 includes all of the first to third color filters 621*a*, 621*b*, and 621*c* corresponding to the first to third emission areas EA1, EA2, and EA3 that emit different colors, the embodiment is not limited thereto. In other examples, the display apparatus 1 may include only one of the color filters of different colors corresponding to one of the emission areas EA that emit different colors. As an example, in case that a light transmittance in a red wavelength band is reduced in the reflection-adjusting layer 625, the display apparatus may include only a red color filter corresponding to the emission area that emits red light. The manufacturing process may be simplified, and a light efficiency may be increased.

In the embodiments, the anti-reflection layer 600 may include the reflection-adjusting layer 625 as shown in FIG. 5, include the first to third color filters 621*a*, 621*b*, and 621*c* as shown in FIG. 6, or include the reflection-adjusting layer 625 and the color filters 621*a*, 621*b*, and 621*c* as shown in FIG. 7, and may increase a transmittance of light emitted from the first to third organic light-emitting diodes OLED1, OLED2, and OLED3 through the above structure. As a comparative example, in the case where a polarizer is used as the anti-reflection layer to reduce external light reflection, a transmittance of light emitted from the first to third organic light-emitting diodes OLED1, OLED2, and OLED3 may be reduced by the polarizer. However, because the display apparatus 1 according to the embodiment includes the reflection-adjusting layer 625 and/or the first to third color filters 621*a*, 621*b*, and 621*c*, a light transmittance may be increased, and simultaneously, external light reflection may be reduced.

Figure 8:
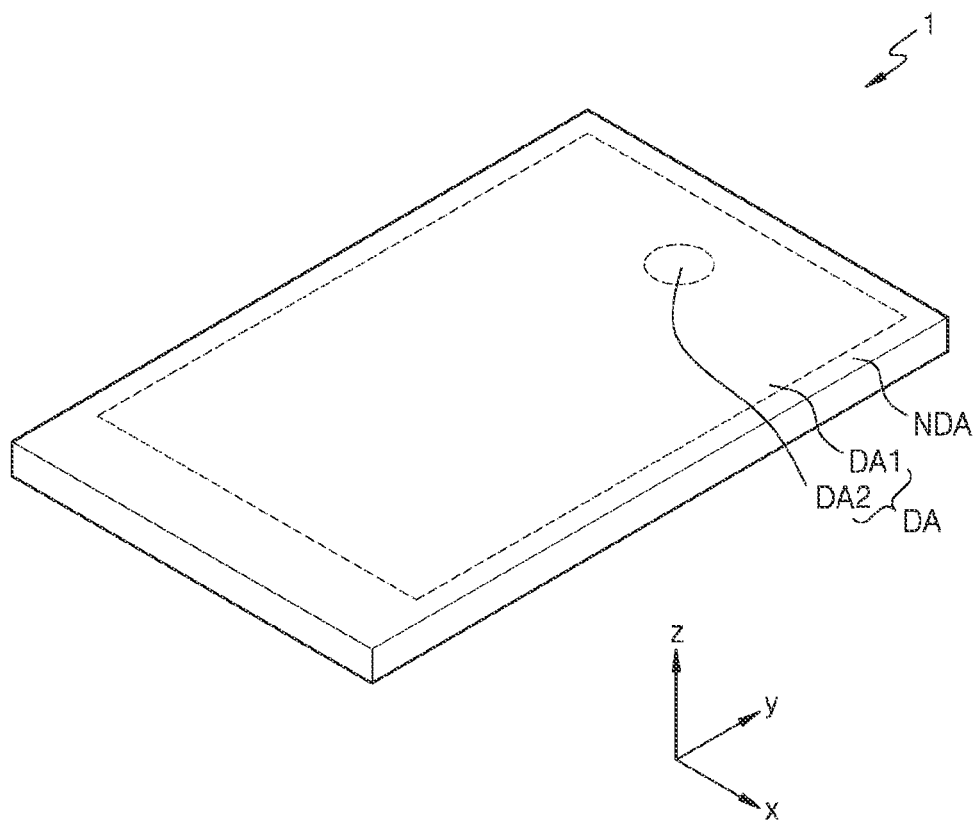
FIG. 8 is a schematic perspective view of a display apparatus according to an embodiment.

FIG. 8 is a schematic perspective view of a display apparatus 1 according to an embodiment.

Referring to FIG. 8, the display panel 1 may include the display area DA, and the non-display area NDA outside the display area DA. The display area DA may include a first display area DA1 and a second display area DA2. The second display area DA2 may be a region in which a component for adding various functions to the display apparatus 1. The second DA2 may correspond to a component area.

As shown in FIG. 8, the area of the second display area DA2 may be less than the area of the first display area DA1. Though it is shown in FIG. 8 that the second display area DA2 is surrounded by the first display area DA1 entirely, the embodiment is not limited thereto. In an embodiment, the second display area DA2 may be partially surrounded by the first display area DA1.

Figure 9:
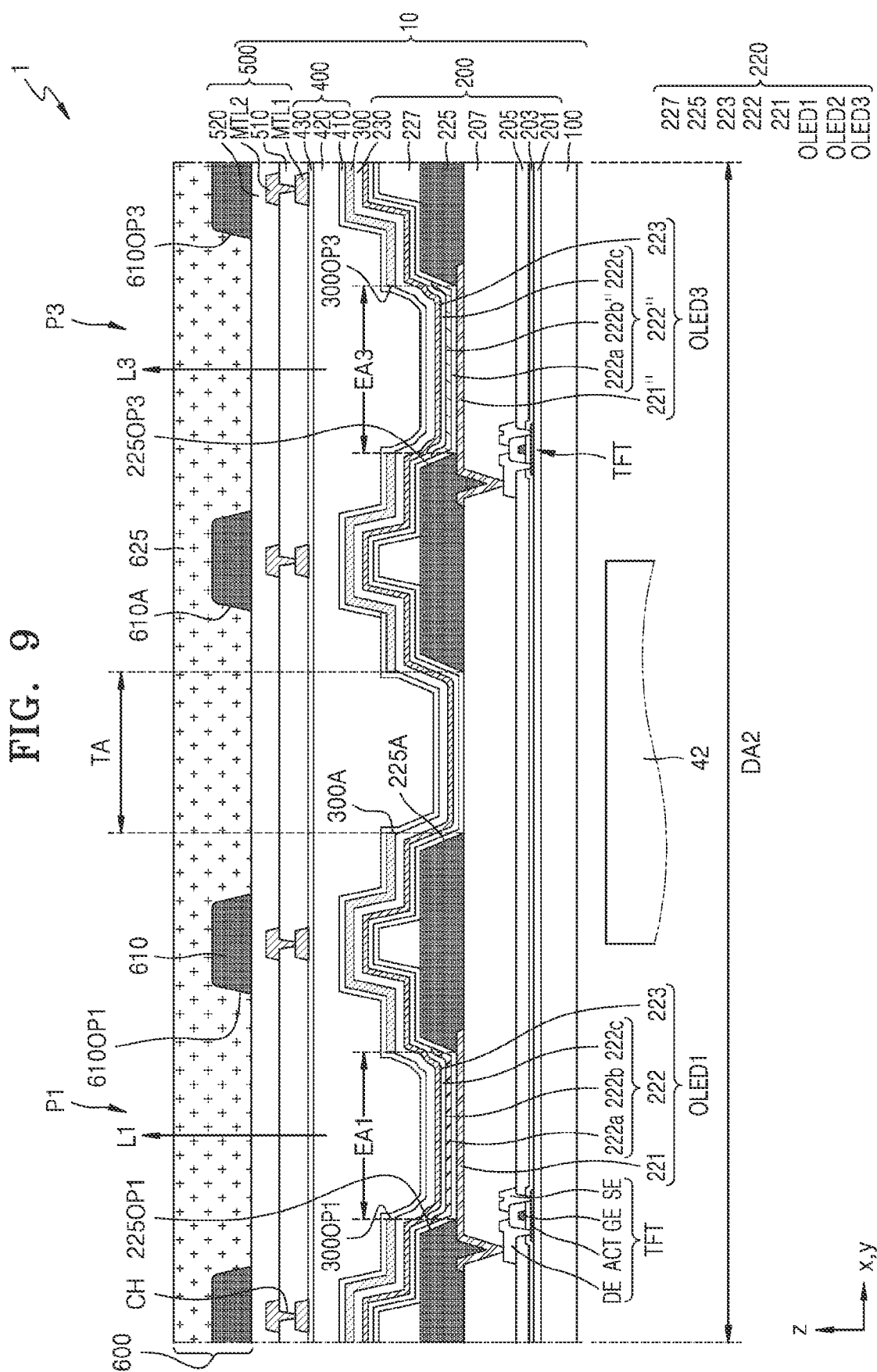
FIG. 9 is a schematic cross-sectional view of a portion of a second display area of a display apparatus according to an embodiment.
Figure 10:
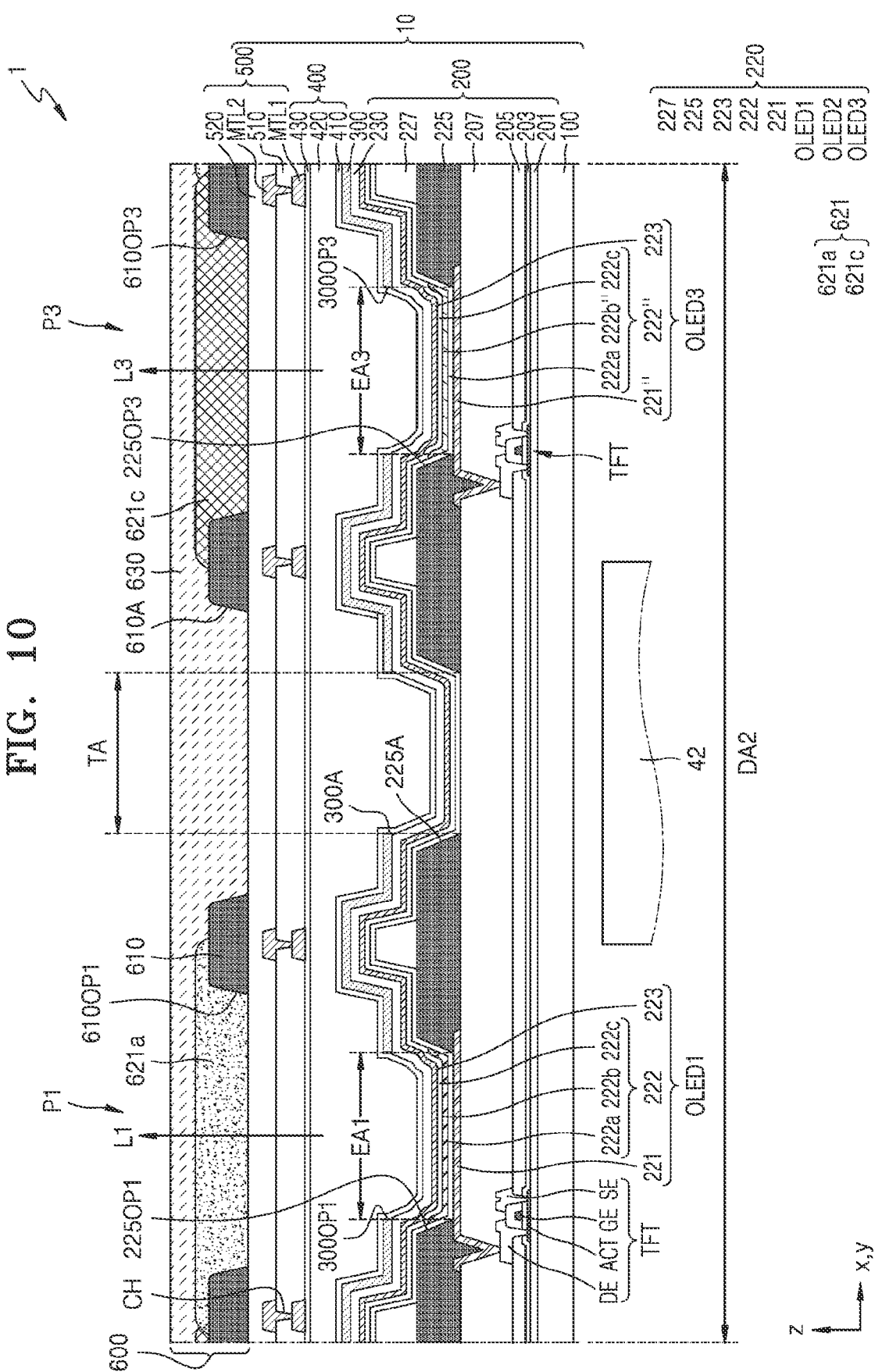
FIGS. 10 and 11 are schematic cross-sectional views of a portion of a second display area of a display apparatus according to an embodiment, showing modified embodiments of FIG. 9.
Figure 11:
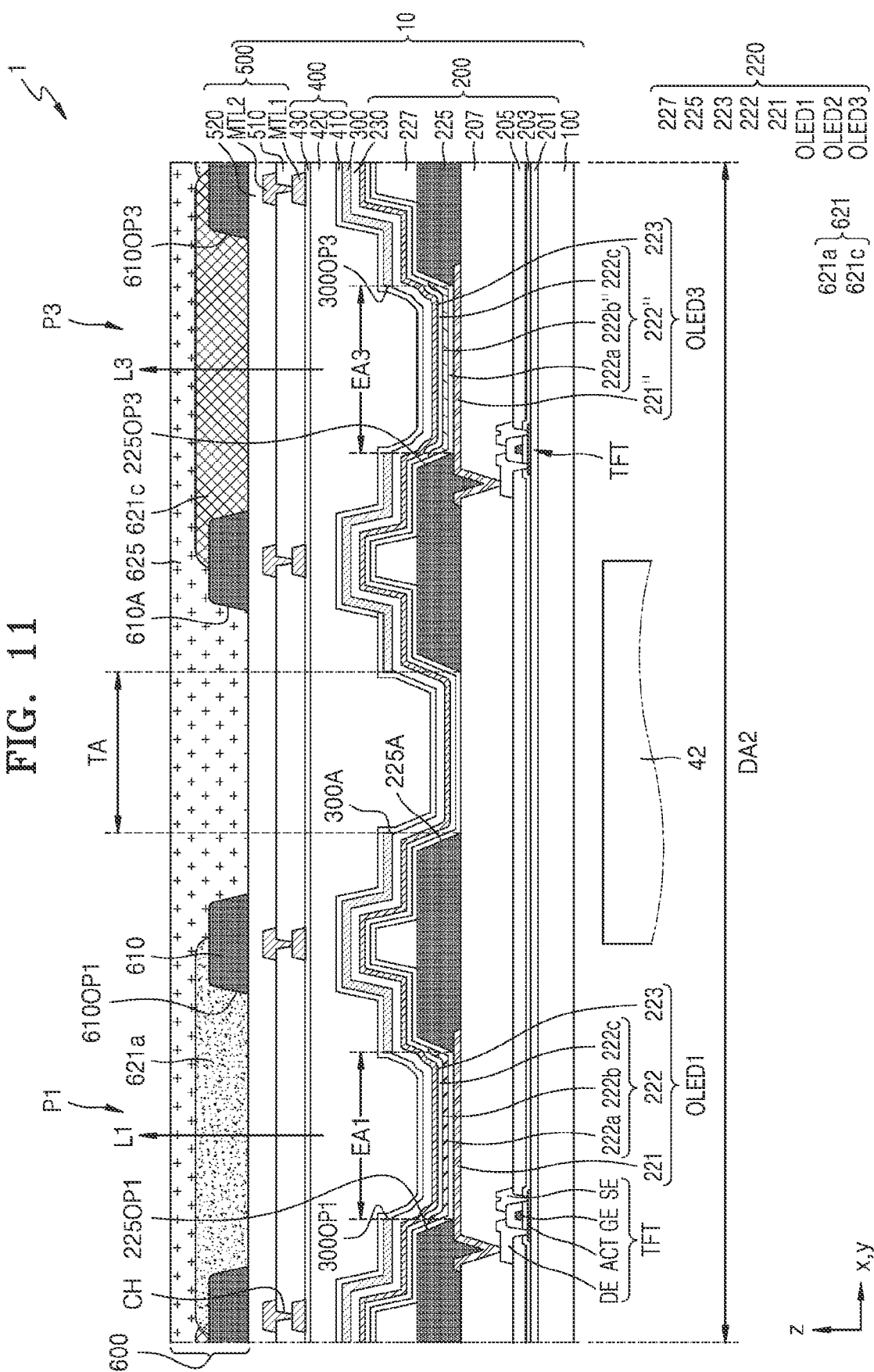

FIG. 9 is a schematic cross-sectional view of a portion of the second display area DA2 of the display apparatus 1 according to an embodiment, and FIGS. 10 and 11 are cross-sectional views of a portion of the second display area DA2 of the display apparatus 1 according to an embodiment, showing modified embodiments of FIG. 9.

In an embodiment, the display apparatus 1 may include a display panel 10 and a component 42 overlapping the display panel 10 and being below the display panel 10. As shown in FIGS. 9 to 11, the component 42 may be disposed in the second display area DA2.

The component 42 may include a sensor such as a proximity sensor, an illuminance sensor, an iris sensor, and a face recognition sensor, and a camera (or an image sensor). The component 42 may use light. As an example, the component 42 may emit and/or receive light in infrared, ultraviolet, and visible light bands. A proximity sensor that uses an infrared ray may detect an object that is near the upper surface of the display apparatus 1, and an illuminance sensor may detect brightness of light incident to the upper surface of the display apparatus 1. An iris sensor may photograph a person's iris arranged on the upper surface of the display apparatus 1, and a camera may detect light from an object disposed facing the upper surface of the display apparatus 1.

The display apparatus 1 may include the substrate 100, the display layer 200, the low reflection layer 300, the thin-film encapsulation layer 400, the touch sensor layer 500, and the anti-reflection layer 600, the display layer 200 including the thin-film transistor TFT and the organic light-emitting diode OLED as the display element electrically connected to the thin-film transistor TFT. In FIGS. 9, 10, and 11, the same reference numerals as those of FIGS. 5, 6, and 7 denote the same elements, and thus, repetitive descriptions thereof are omitted.

The first to third emission areas EA1, EA2, and EA3 respectively emitting light of different colors may be arranged in each of the first display area DA1 and the second display area DA2. As described above, the first to third emission areas EA1, EA2, and EA3 may be defined by the first to third lower openings 225OP1, 225OP2, and 225OP3 of the bank 225 described above with reference to FIG. 5.

Unlike the first display area DA1, the second display area DA2 may include a transmission area TA. The transmission area TA may be disposed between emission areas that are adjacent to each other. In an embodiment, as shown in FIGS. 9 to 11, the transmission area TA may be disposed between emission areas that emit light of different colors. However, the embodiment is not limited thereto. In another embodiment, the transmission area TA may be disposed between emission areas that emit light of the same color.

Referring to FIG. 9, in the second display area DA2, the first emission area EA1 corresponding to the first organic light-emitting diode OLED1, the second emission area EA2 corresponding to the second organic light-emitting diode OLED2, and the transmission area TA may be arranged such that the transmission area TA is disposed between the first and second emission areas EA1 and EA2. As described above, because the component 42 may use light, the component 42 may overlap the transmission area TA that has a high light transmittance.

The bank layer 225 may include the first lower opening 225OP1 that defines the first emission area EA1, and the third lower opening 225OP3 that defines the third emission area EA3, and include a first transmission opening 225A corresponding to the transmission area TA. The first transmission opening 225A may be disposed between the first lower opening 225OP1 and the third lower opening 225OP3.

The low reflection layer 300 may include an opening 300A corresponding to the transmission area TA. For example, the low reflection layer 300 may include the opening 300A that overlaps the first transmission opening 225A of the bank layer 225 in a plan view, and that defines the transmission area TA.

The width of the opening 300A of the low reflection layer 300 that overlaps the first transmission opening 225A of the bank layer 225 may be the same as the size (the area or width) of the first transmission opening 225A as shown in FIG. 9. However, the embodiment is not limited thereto. In other examples, the width of the opening 300A of the low reflection layer 300 that overlaps the first transmission opening 225A of the bank layer 225 may be less or greater than the size (the area or width) of the first transmission opening 225A.

In a comparative example, in the case where the low reflection layer 300 is disposed over the entire surface of the display area DA including the transmission area TA, the light transmittance of the transmission area TA is reduced and a light efficiency of the display apparatus 1 may be reduced. In the embodiments, because the low reflection layer 300 has the opening 300A corresponding to the transmission area TA, the light transmittance of the transmission area TA may be increased.

Though it is shown in FIG. 9 that the second electrode 223 covers the transmission area TA, in other examples, the second electrode 223 may have an opening that corresponds to the transmission area TA, similar to the low reflection layer 300. Similarly, though it is shown in FIG. 9 that the insulating layers between the substrate 100 and the bank layer 225, for example, the planarization layer 207, the interlayer insulating layer 205, and the gate insulating layer 203 cover the transmission area TA, in other examples, at least one of the insulating layers may have an opening that corresponds to the transmission area TA.

The anti-reflection layer 600 may include the light-blocking layer 610 and an upper layer (not shown) comprising a dye or a pigment. In an embodiment, the upper layer 620 may include the reflection-adjusting layer 625 and/or the first and third color filters 621a and 621c (refer to FIGS. 10 and 11).

The light-blocking layer 610 may include the first upper opening 610OP1 that corresponds to the first emission area EA1, and the third upper opening 610OP3 that corresponds to the third emission area EA3, and include a second transmission opening 610A arranged between the first upper opening 610OP1 and the third upper opening 610OP3 and corresponding to the transmission area TA.

The second transmission opening 610A of the light-blocking layer 610 may overlap the first transmission opening 225A of the bank layer 225 that defines the transmission area TA. The width of the second transmission opening 610A of the light-blocking layer 610 may be less than the width of the first transmission opening 225A of the bank layer 225 that corresponds to the transmission area TA.

The width of the opening 300A of the low reflection layer 300 that corresponds to the transmission area TA may be less than the width of the second transmission opening 610A of the light-blocking layer 610. In an embodiment, at least a portion of the low reflection layer 300 may overlap the second transmission opening 610A and may not overlap the first transmission opening 225A of the bank layer 225. When a portion of the low reflection layer 300 is disposed in this region, the external light reflection may be suppressed without reducing a light transmittance of the transmission area TA.

Referring to FIG. 9, in an embodiment, the upper layer may include the reflection-adjusting layer 625. The reflection-adjusting layer 625 may be arranged over the entire surface of the second display area DA2 including the transmission area TA. The reflection-adjusting layer 625 may at least partially fill the second transmission opening 610A of the light-blocking layer 610, the first and third upper openings 610OP1 and 610OP3. Because the reflection-adjusting layer 625 selectively absorbs light in some of the wavelength bands of external incident light and reflected light, the visibility of the display apparatus 1 may be improved.

Referring to FIG. 10, in an embodiment, the upper layer may include the color filter layer 621 instead of the reflection-adjusting layer 625, and the anti-reflection layer 600 may include the overcoat layer 630 disposed on the light-blocking layer 610 and the first and third color filters 621a and 621c. The upper layer may include the first color filter 621a corresponding to the first emission area EA1 and the third color filter 621c corresponding to the third emission area EA3. The overcoat layer 630 may at least partially fill the second transmission opening 610A.

Referring to FIG. 11, in an embodiment, the upper layer may include the color filter layer 621, the first and third color filters 621a and 621c. The upper layer may include the first color filter 621a corresponding to the first emission area EA1 and the third color filter 621c corresponding to the third emission area EA3, and the reflection-adjusting layer 625 may at least partially fill the second transmission opening 610A.

In an embodiment, to improve a light efficiency of the display apparatus 1, the reflection-adjusting layer 625, and/or the first and third color filters 621a and 621c, and the low reflection layer 300 including the openings corresponding to the emission area EA and the transmission area TA may be provided. Referring to FIGS. 9 to 11, because the low reflection layer 300 includes an opening that corresponds to the transmission area TA, external light reflection of the display apparatus 1 may be reduced, and thus, visibility may be improved, and simultaneously, a light transmittance of the transmission area TA may be improved.

In an embodiment, a display apparatus configured as above may provide improved visibility and high brightness by including the low reflection layer having an opening that corresponds to an emission area, and thus, reducing external light reflection. However, the scope of the disclosure is not limited to this effect.

It should be understood that embodiments described herein should be considered in a descriptive sense only and not for purposes of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. While the embodiments have been described with reference to the figures, it will be understood by those of ordinary skill in the art that various changes in form and details may be made therein without departing from the spirit and scope as defined by the following claims.

What is claimed is:

1. A display apparatus comprising:
a display element layer disposed over a substrate, the display element layer including:
display elements; and
a bank layer including a lower opening corresponding to each of the display elements, the lower opening defining an emission area in each of the display elements;
a low reflection layer disposed over the display element layer, the lower reflection layer including an inorganic material, the low reflection layer including an opening corresponding to the emission area in each of the display elements; and
a light-blocking layer disposed over the low reflection layer, the light-blocking layer including an upper opening that overlaps the lower opening, in a plan view.

2. The display apparatus of claim 1, further comprising:
an upper layer disposed on the light-blocking layer, the upper layer including a dye or a pigment.

3. The display apparatus of claim 2, wherein the upper layer includes color filters, each of the color filters having a color that respectively corresponds to the display elements, the color of each of the color filters being different.

4. The display apparatus of claim 2, wherein the upper layer includes a reflection-adjusting layer provided as an integral body and corresponding to the display elements.

5. The display apparatus of claim 1, wherein the low reflection layer includes at least one of a metal and a metal oxide.

6. The display apparatus of claim 5, wherein the low reflection layer includes at least one of bismuth (Bi), ytterbium (Yb), cobalt (Co), molybdenum (Mo), titanium (Ti), zirconium (Zr), aluminum (Al), chrome (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and a combination thereof.

7. The display apparatus of claim 1, wherein a refractive index of the low reflection layer is about 1 or more.

8. The display apparatus of claim 1, wherein the bank layer includes a light-blocking material.

9. The display apparatus of claim 1, further comprising:
a capping layer disposed on the display element layer,
wherein the low reflection layer is disposed directly on the capping layer.

10. The display apparatus of claim 1, wherein the upper opening has a width greater than a width of the lower opening.

11. The display apparatus of claim 1, further comprising:
a thin-film encapsulation layer disposed on the low reflection layer; and
a touch sensor layer disposed on the thin-film encapsulation layer,
wherein the light-blocking layer is disposed on the touch sensor layer.

12. A display apparatus comprising:
a first electrode;
a bank layer covering edges of the first electrode, the bank layer including a lower opening that overlaps the first electrode, in a plan view;
an intermediate layer disposed on the bank layer, the intermediate layer overlapping the first electrode through the lower opening, in a plan view;
a second electrode disposed on the intermediate layer;
a low reflection layer disposed on the second electrode, the low reflection layer including an opening that overlaps the lower opening of the bank layer, in a plan view; and
a light-blocking layer disposed on the low reflection layer, the light-blocking layer including an upper opening that overlaps the lower opening, in a plan view.

13. The apparatus of claim 12, further comprising:
an upper layer disposed on the light-blocking layer, the upper layer including a dye or a pigment.

14. The display apparatus of claim 12, wherein the low reflection layer includes at least one of a metal and a metal oxide.

15. The display apparatus of claim 14, wherein the low reflection layer includes at least one of bismuth (Bi), ytterbium (Yb), cobalt (Co), molybdenum (Mo), titanium (Ti), zirconium (Zr), aluminum (Al), chrome (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and a combination thereof.

16. The display apparatus of claim 12, wherein a refractive index of the low reflection layer is about 1 or more.

17. The display apparatus of claim 12, wherein the bank layer includes a light-blocking material.

18. The display apparatus of claim 12, further comprising:
a capping layer disposed on the second electrode,
wherein the low reflection layer is disposed directly on the capping layer.

19. The display apparatus of claim 12, wherein the upper opening has a width greater than a width of the lower opening.

20. The display apparatus of claim 12, further comprising:
a thin-film encapsulation layer disposed on the low reflection layer; and
a touch sensor layer disposed on the thin-film encapsulation layer,
wherein the light-blocking layer is disposed on the touch sensor layer.

* * * * *